(12) United States Patent
Abraham

(10) Patent No.: US 7,378,681 B2
(45) Date of Patent: May 27, 2008

(54) RIDGE WAVEGUIDE DEVICE SURFACE PASSIVATION BY EPITAXIAL REGROWTH

(75) Inventor: Patrick Abraham, Santa Barbara, CA (US)

(73) Assignee: Agility Communications, Inc., Goleta, CA (US)

( * ) Notice: Subject to any disclaimer, the term of this patent is extended or adjusted under 35 U.S.C. 154(b) by 583 days.

(21) Appl. No.: 10/639,093

(22) Filed: Aug. 12, 2003

(65) Prior Publication Data

US 2004/0033044 A1   Feb. 19, 2004

Related U.S. Application Data

(60) Provisional application No. 60/402,666, filed on Aug. 12, 2002.

(51) Int. Cl.
*H01L 21/00*   (2006.01)
*H01L 21/265*   (2006.01)

(52) U.S. Cl. .............................. 257/22; 438/31; 438/16; 438/29; 438/518

(58) Field of Classification Search ................ 385/129; 438/478, 518, 16, 22, 27, 29, 31–32
See application file for complete search history.

(56) References Cited

U.S. PATENT DOCUMENTS 4,438,447 A * 3/1984 Copeland et al. ............. 257/82
4,973,858 A * 11/1990 Chang ......................... 327/514
5,504,768 A * 4/1996 Park et al. ..................... 438/39
5,541,950 A * 7/1996 Kizuki et al. ............. 372/46.01
5,640,410 A * 6/1997 Yang ........................ 372/46.01
5,770,868 A * 6/1998 Gill et al. ..................... 257/190
6,002,700 A * 12/1999 Sato ............................... 372/45
6,127,691 A * 10/2000 Fukunaga et al. ............. 257/17
6,614,821 B1 * 9/2003 Jikutani et al. ........... 372/43.01
6,788,838 B2 * 9/2004 Ho ................................ 385/15
6,940,878 B2 * 9/2005 Orenstein et al. ............. 372/20
6,984,840 B2 * 1/2006 Kuramata et al. ............. 257/11
2004/0033004 A1 * 2/2004 Welch et al. ................... 385/14

OTHER PUBLICATIONS

Wipiejewski, T., et al., "Performance and Reliability of Widely Tunable Laser Diodes" ECTC, 52nd, New Orleans, May 2003.

* cited by examiner

*Primary Examiner*—Chuong A. Luu
(74) *Attorney, Agent, or Firm*—Allen, Dyer, Doppelt, Milbrath & Gilchirst, P.A.

(57) ABSTRACT

A method for reducing surface recombination in an area next to a mesa in devices containing active and passive sections. This is obtained by growing, by metalorganic vapor phase epitaxy (MOVPE), a thin epitaxial layer of material with larger bandgap than a waveguide material and preferably smaller surface recombination rate than the waveguide material. This thin layer is preferably non-intentionally doped to avoid creating a surface leakage path, thin enough to allow for carrier to diffuse to and thermalize in the waveguide layer and thick enough to prevent carriers to tunnel through it.

19 Claims, 11 Drawing Sheets

SECTION A-A

SECTION A-A

SECTION A-A

SECTION A-A

RIDGE WAVEGUIDE DEVICE SURFACE PASSIVATION BY EPITAXIAL REGROWTH

CROSS-REFERENCE TO RELATED APPLICATIONS

This application claims the benefit under 35 U.S.C. §119(e) of co-pending and commonly-assigned U.S. provisional patent application Ser. No. 60/402,666, filed Aug. 12, 2002, by Patrick Abraham, and entitled "RIDGE WAVEGUIDE DEVICE SURFACE PASSIVATION BY EPITAXIAL REGROWTH," which application is incorporated by reference herein.

BACKGROUND OF THE INVENTION

1. Field of the Invention.

This invention relates to microelectronic and optoelectronic components, and more particularly, to ridge waveguide device surface passivation by epitaxial regrowth.

2. Description of the Related Art.

A ridge waveguide provides lateral control of electrical and optical confinement in active and passive sections of integrated optical devices. The ridge (or mesa) is formed above the active or guiding region, where the active or guiding region is not restricted in the lateral direction. The electrical lateral confinement is achieved by the finite spread of injection current in the active or guiding layer, due to the finite width of the above ridge. The optical lateral confinement is obtained by the waveguiding due to the ridge.

In the case of a laser or a semiconductor optical amplifier (SOA), the waveguide can be active and electrical carrier injection allows for amplification of the light traveling in the waveguide. In the case of a tuning section with a distributed Bragg reflector, a phase section, a branch of a Mach-Zehnder interferometer, the waveguide can be passive and electrical carrier injection is then intended to produce a refractive index change.

Precise control of the optical and electrical confinement requires the ridge (or mesa) etch to stop precisely and controllably with respect to the waveguide. FIG. 1 is a perspective view of a typical ridge waveguide structure. For the electrical confinement to be efficient, the mesa structure 1 has to be defined as close as possible to area 2 of the waveguide layer 3 where the carrier needs to be injected. A selective etch stopping on the waveguide 3 material is thus the preferred way of achieving this.

This proves to work well for ridge lasers where quantum wells (QWs) are located typically 1000 Å or more from the surface in the middle of the waveguide 3. However, exposing the surface of the waveguide 3 of an active section with a shallow QW or exposing the surface of a passive waveguide in which carriers are injected becomes a problem. This is because the surface recombination properties of the waveguide 3 material may not be adequate for it to be exposed. In the case of a shallow QW under the surface, the energy released by non-radiative carrier recombination at the surface 4 next to the mesa 1 accelerates the aging of the active section. In the case of a passive section, the problem is even more severe because there is no QW in the waveguide layer 3 with high carrier collection efficiency to keep the carrier away from the surface. The effect is then clearly visible on both the injection efficiency and the aging of the passive section.

FIG. 2 is a perspective view of a typical ridge waveguide structure with a surface passivation layer defined by selective wet etch. The problem described above can be solved for all active or all passive section devices by introducing a stop etch layer 5 above the waveguide and separated from it by a thin (typically 50 nm) layer 6 whose bandgap is larger than that of the waveguide material 7. After patterning of the surface to define the mesa and removing the contact layer 8, a selective wet etch is used to remove the upper cladding layer 9 and stop on the stop etch layer 5. Another selective wet etch can then be used to remove the stop etch layer 5 outside the mesa and stop on the passivation layer 6. This layer acts as a barrier and keeps the carriers away from the surface 10. The accuracy of the etch is preserved and the perturbation on the electrical and optical confinement is minimum.

In the case of an integrated optical device where both active and passive sections are present, the use of such a solution has never been reported and would be difficult to implement because of the difficulty to preserve the integrity or continuity of an etch stop layer.

It is common practice to deposit a dielectric layer on the sidewalls and on either side of the ridge of ridge waveguide lasers to prevent short circuits between the metal contacting the top of the ridge and the waveguide material in the field. U.S. Pat. No. 5,640,410, which is incorporated by reference herein, describes such a method. FIG. 3 shows a cross section perpendicular to the ridge of a completed device fabricated using a similar method, where 11 is the substrate, 12 is the highly doped lower cladding layer, 13 is the waveguide layer, 14 is the highly doped semiconductor contact layer of opposite conduction type than the lower cladding layer 12, 15 is a dielectric layer 16 is the metal contacting the top of the ridge and 17 is the metal layer contacting the bottom of the substrate. Although such a layer as the dielectric layer 15 is referred to as a passivation layer in U.S. Pat. No. 5,640,410, it does not reduce significantly the carrier recombination at the surface of the exposed waveguide layer 13, because it does not remove the main cause for the formation of non-radiative recombination traps at the surface of the waveguide layer 13, namely the fact that the crystal stops at the waveguide upper interface, and it does not prevent the carriers in the waveguide layer to reach them.

An efficient way to remove the recombination traps at the surface of the waveguide layer is to have the crystalline material extend further than the upper interface of the waveguide layer. It can be done by using a structure where the ridge is buried, e.g., BRS (Buried Ridge Structure) or pn BH (Buried Heterostructure), instead of a ridge waveguide structure. However, this structure is totally different from a ridge waveguide structure and requires the development and use of additional process steps that limit the end-to-end chip yield:

A buried ridge structure requires etching through the waveguide to form mesas.

Etch through the waveguide layer can potentially create defects where the waveguide layer intersects the mesa sidewalls. This is especially true with the use of plasma dry etch.

Defects created where the waveguide layer intersects the mesa sidewalls can propagate further in the waveguide layer and degrade the performance and lifetime of the device.

A combination of dry and wet etch can be used to limit the risk of defect formation where the waveguide layer intersects the mesa walls. However, the control of etch depth uniformity and undercut uniformity is then degraded by the poor uniformity of the wet etch process over large surfaces without a stop etch layer.

The mesa height needs to be very uniform over the surface of the wafer for the coverage by the subsequent regrowths and the device performance to be uniform.

Etching of deep mesas and thick and/or multiple regrowth degrades the morphology of the wafer and greatly contributes to decreasing chip yield.

Furthermore, a buried hetero-structure or a buried ridge structure may be incompatible with other critical functions such as the modulator due to high capacitance.

SUMMARY OF THE INVENTION

The present invention describes a method for reducing surface recombination in an area next to a mesa in optoelectronic devices, such as tunable lasers, containing active sections and/or passive sections. This is obtained by epitaxially growing, by metalorganic vapor phase epitaxy (MOVPE), a thin epitaxial layer of material with a larger bandgap than a waveguide material in order to reduce carrier surface recombination with the waveguide material in the area.

The waveguide is comprised of an InGaAsP alloy substantially lattice-matched to InP, and the thin layer is comprised of InP or another InGaAsP alloy substantially lattice-matched to InP and with a higher bandgap than the waveguide.

The thin epitaxial layer is doped in such a manner as to avoid creating a surface leakage path, and more specifically, is non-intentionally doped to minimize the conductivity of the thin layer.

The result is an optical semiconductor device, comprising a mesa and an area next to the mesa having a thin epitaxial layer of material with a larger bandgap than a waveguide material and a smaller carrier surface recombination rate than the waveguide material.

The carrier surface recombination is reduced by the combined effects of:

Moving the crystal discontinuity—the interface between the semiconductor and air or vacuum or a polycrystalline layer—that is responsible for recombination defects away from the waveguide.

Preventing carriers from accumulating close to the crystal discontinuity described above by choosing the material of the thin epitaxial layer so that it has a larger band gap than the waveguide.

Making the thin epitaxial layer thin enough that carriers are likely to be captured by the waveguide layer where their energy is lower and no more surface recombination defects are present.

Making the thin layer thick enough that carriers in the waveguide can't tunnel through it to recombine at the surface of the thin epitaxial layer.

BRIEF DESCRIPTION OF THE DRAWINGS

Referring now to the drawings in which like reference numbers represent corresponding parts throughout.

DETAILED DESCRIPTION OF THE INVENTION

Figure 1:
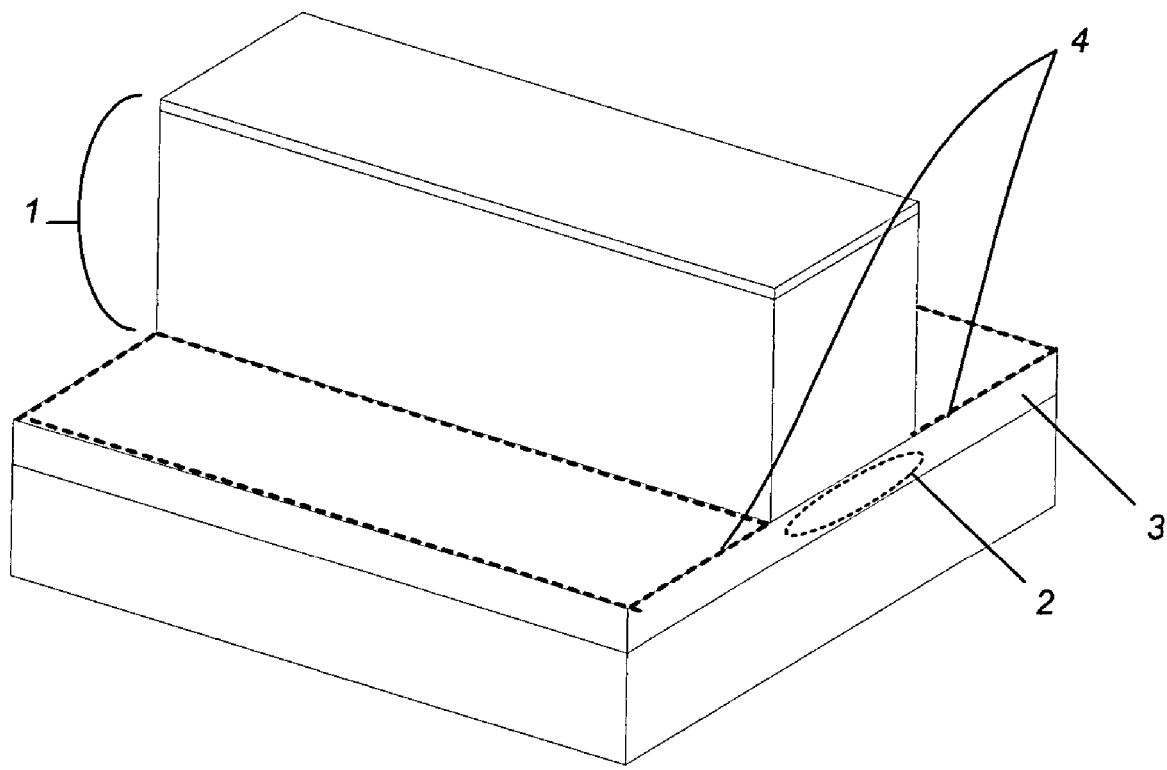
FIG. 1 is a perspective view of a typical ridge waveguide structure.
Figure 2:
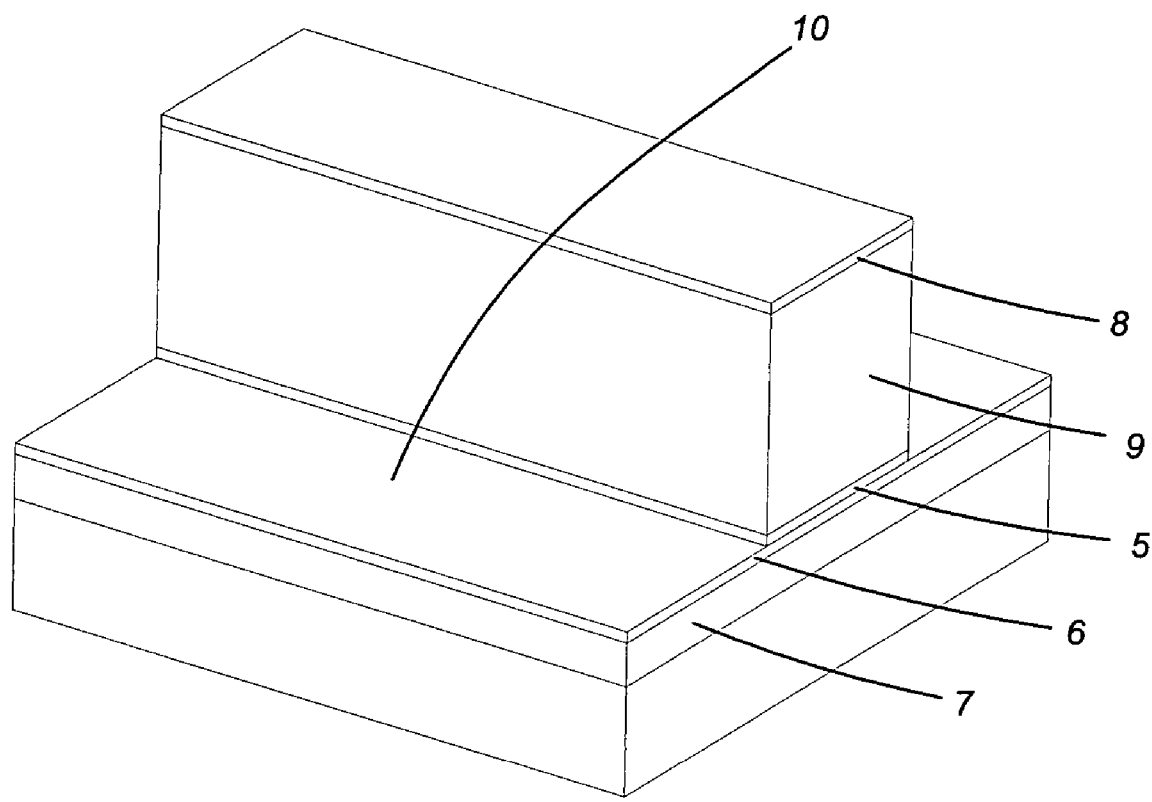
FIG. 2 is a perspective view of a typical ridge waveguide structure with a surface passivation layer defined by selective wet etch.
Figure 3:
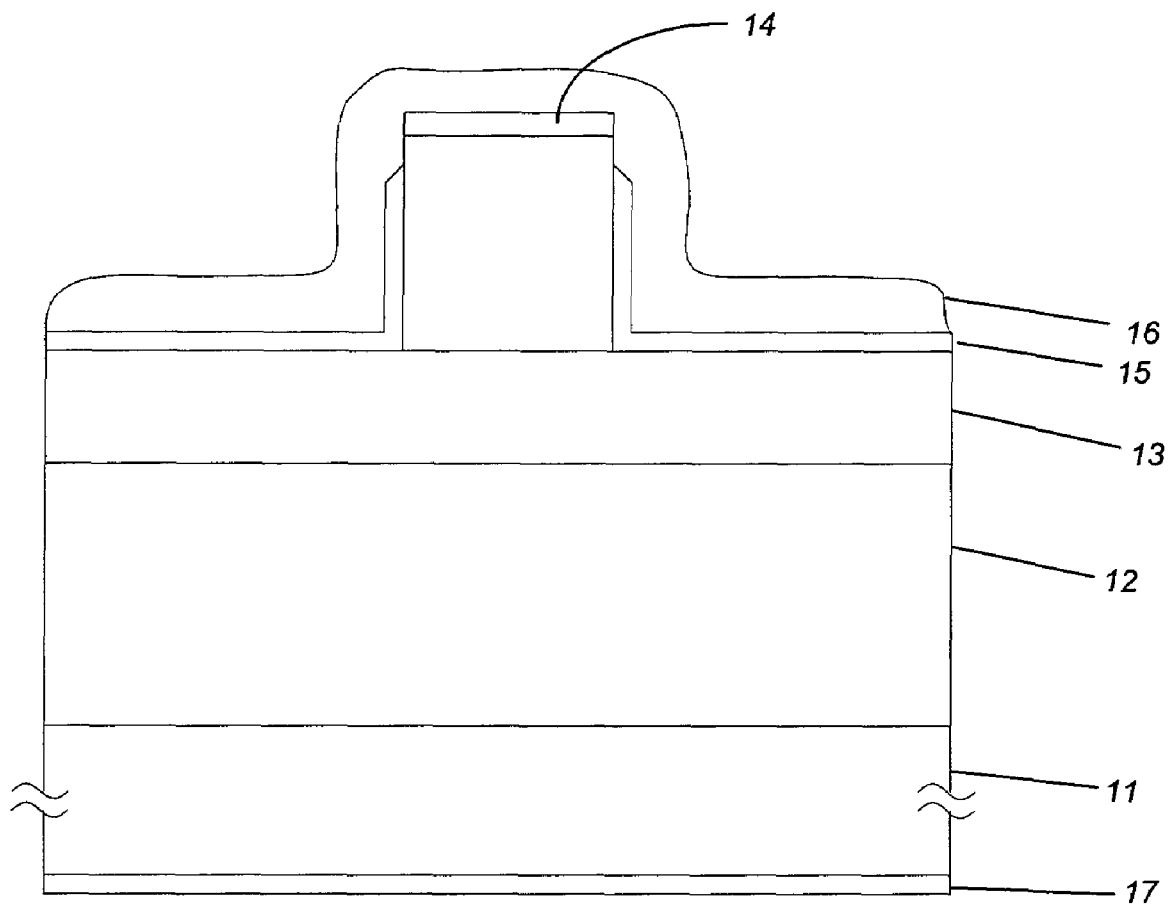
FIG. 3 is a cross-sectional view of a ridge waveguide laser with a dielectric layer isolating the metal contacting the top of the ridge from the waveguide layer.
Figure 4A:
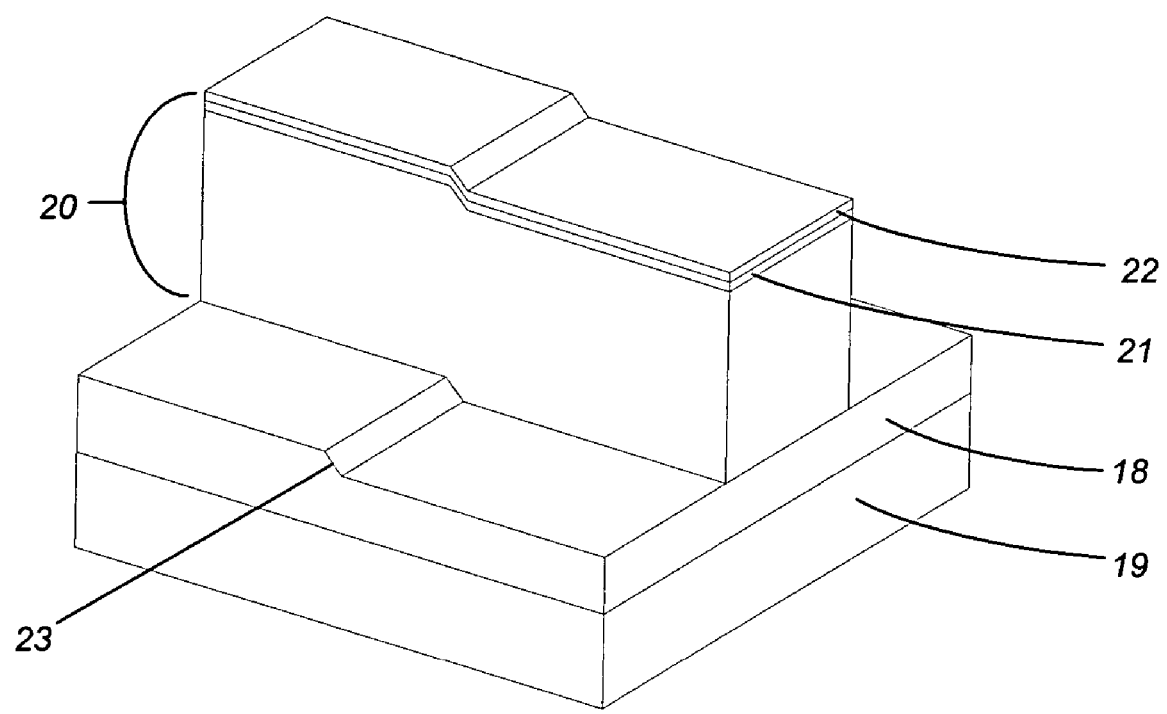
FIGS. 4A-4B are perspective views showing the steps in manufacturing a ridge waveguide device according to an embodiment of the present invention.
Figure 4B:
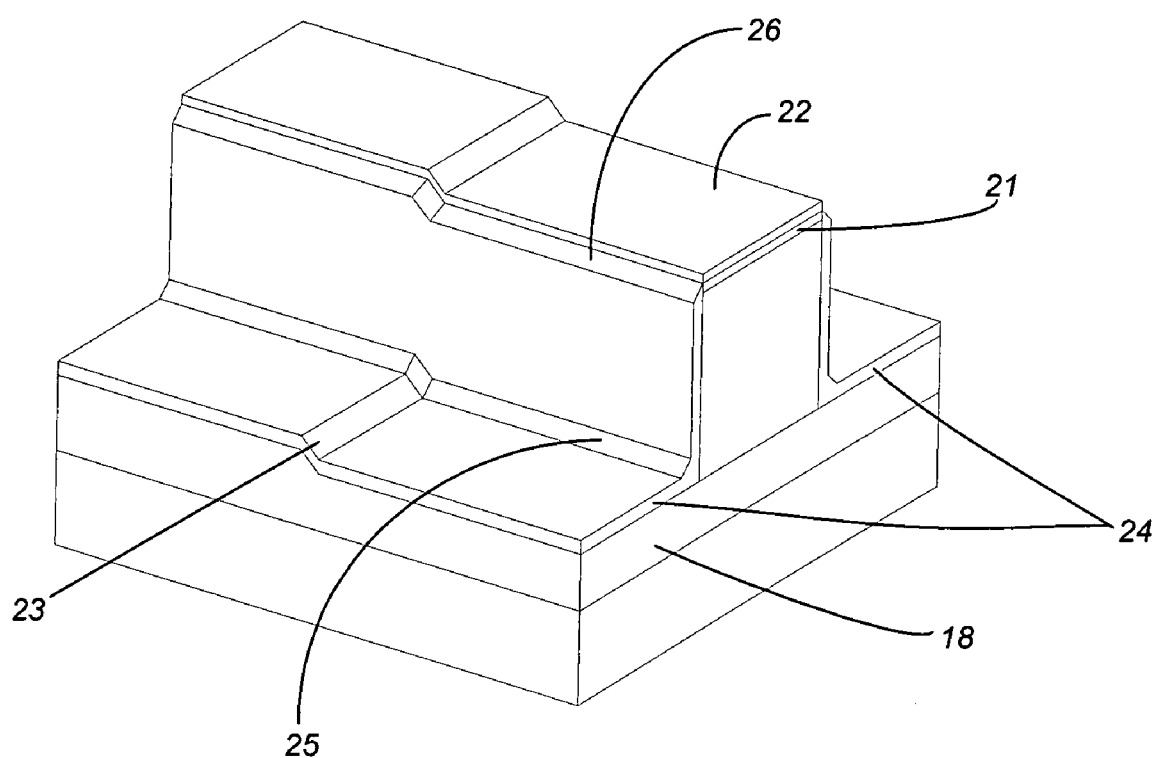

FIGS. 4A-4B are perspective views showing the steps in manufacturing a ridge waveguide device according to an embodiment of the present invention.

In FIG. 4A, an optoelectronic device structure, comprising an InGaAsP waveguide 18 grown on a highly doped lower cladding layer 19 itself grown on an InP (100) plane n-type substrate with a mesa 20 to form a ridge waveguide, is shown after a ridge wet etch, using a HCl-water solution and stopping selectively on the InGaAsP waveguide layer 18, has been performed. The ridge main axis is oriented parallel to the [011] crystallographic direction. The InGaAsP contact layer 21 on top of the mesa 20 is still covered with the dielectric layer 22 used as a mask during the etch of the mesa 20. The interface 23 between an active section and a passive section where the thickness of the waveguide layer 18 changes is shown.

As shown in FIG. 4B, the dielectric stripe mask 22 formed by the dielectric film constituting the upper layer of the mesa structure is directly used as a selective growth mask and an approximately 60 nm thick non-intentionally doped InP layer 24 is epitaxially grown by MOVPE to cover surfaces where the waveguide material was previously exposed, including at the active-passive interface 23. It is also possible to use relatively light doping in layer 24, provided only that a significant shunt current will not flow in it and that the desired heterobarrier is formed with waveguide layer 18. The (n-11)A type crystallographic planes 25 and 26 form at the bottom of the ridge and next to the InGaAsP contact layer 21, respectively. The growth rate on (n-11) A type planes is considerably smaller than on a (100) plane. This produces the thickness of layer 24 in the corner at the foot of the ridge to be weakly dependent on the thickness of the InP layer grown in the field next to the ridge. This makes it possible to minimize and stabilize the effect of the InP layer 24 on the optical mode confinement in the waveguide. After the growth of layer 24, the process can then proceed with removing the dielectric layer on top of the mesa.

FIGS. 5A-5B and FIGS. 5C-5E are perspective and cross-section views, respectively, showing a method in passivating the surface of the waveguide in a multi-section device according to another embodiment of the present invention. In this case, the last epitaxial growth before performing the ridge etch finishes with an approximately 30 nm thick Inp layer 27 on top of the InGaAsP contact layer 21.

Figure 5A:
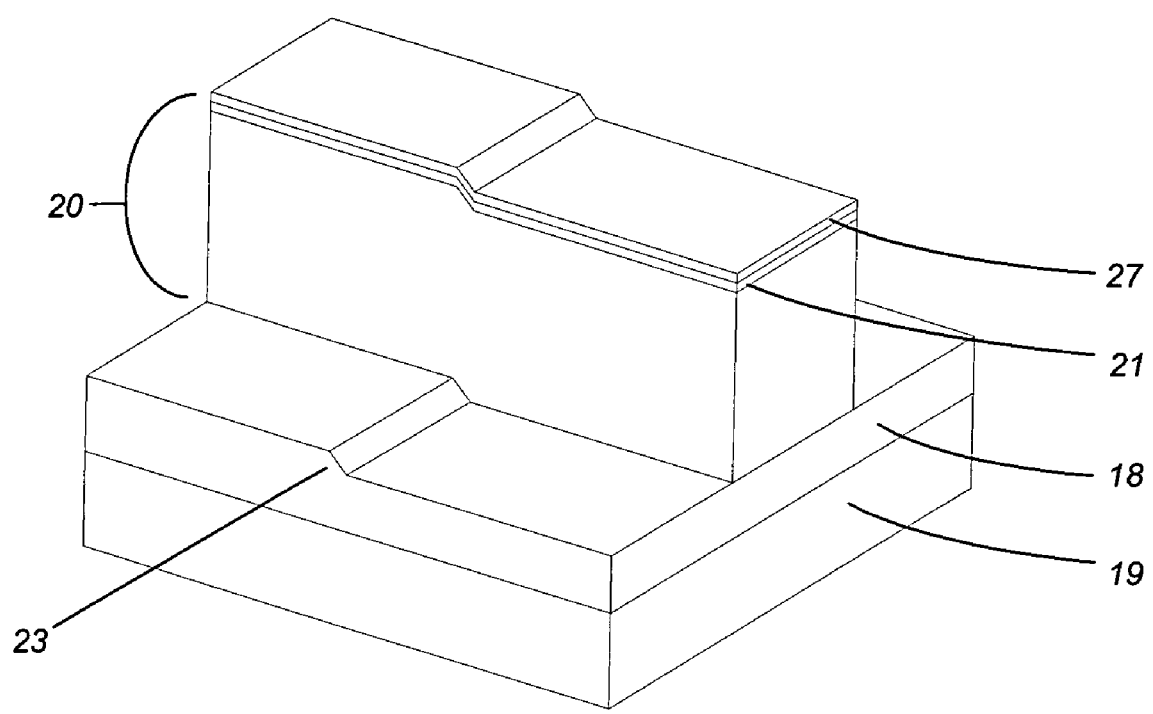
FIGS. 5A-5B and FIGS. 5C-5E are perspective and cross-section views, respectively, showing the steps in manufacturing a ridge waveguide device according to another embodiment of the present invention.

In FIG. 5A, an optoelectronic device structure, comprising an InGaAsP waveguide 18 grown on a highly doped lower cladding layer 19 itself grown on an InP (100) plane n-type substrate with a mesa 20 to form a ridge waveguide, is shown immediately after the dielectric layer (used as a mask to perform the ridge wet etch stopping selectively on the InGaAsP waveguide layer 18) has been removed. The approximately 30 nm thick InP layer 27 is exposed on top of the mesa 20. The ridge wet-etch is performed using a HCl-water solution and stopping selectively on the InGaAsP waveguide layer 18. Other selective etches that are well-known to those skilled in the art may also be used. The ridge main axis is oriented parallel to the [011] crystallographic direction. The interface 23 between an active and a passive section where the thickness of the waveguide layer 18 changes is shown.

Figure 5B:
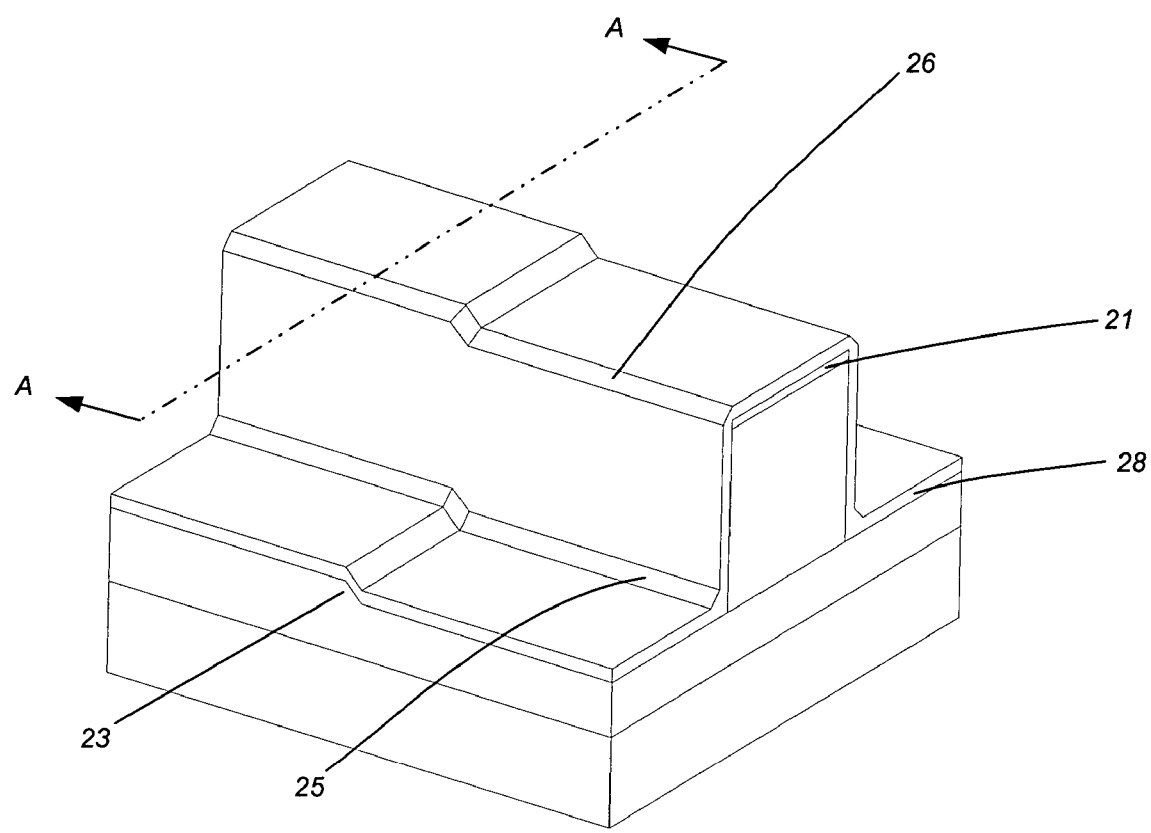

As shown in FIG. 5B, an approximately 60 nm thick non-intentionally doped InP layer 28 is grown by MOVPE to cover all the surfaces including where the waveguide material was previously exposed and the active-passive interface 23. As in the previous example, a light doping may be incorporated, and (n-11)A type crystallographic planes 25 and 26 form at the bottom of the ridge and next to the InGaAsP contact layer 21, respectively. For the same reason, the slow growth rate on (n-11)A type planes makes it possible to minimize and stabilize the effect of the InP layer 28 on the optical mode confinement in the waveguide.

Figure 5C:
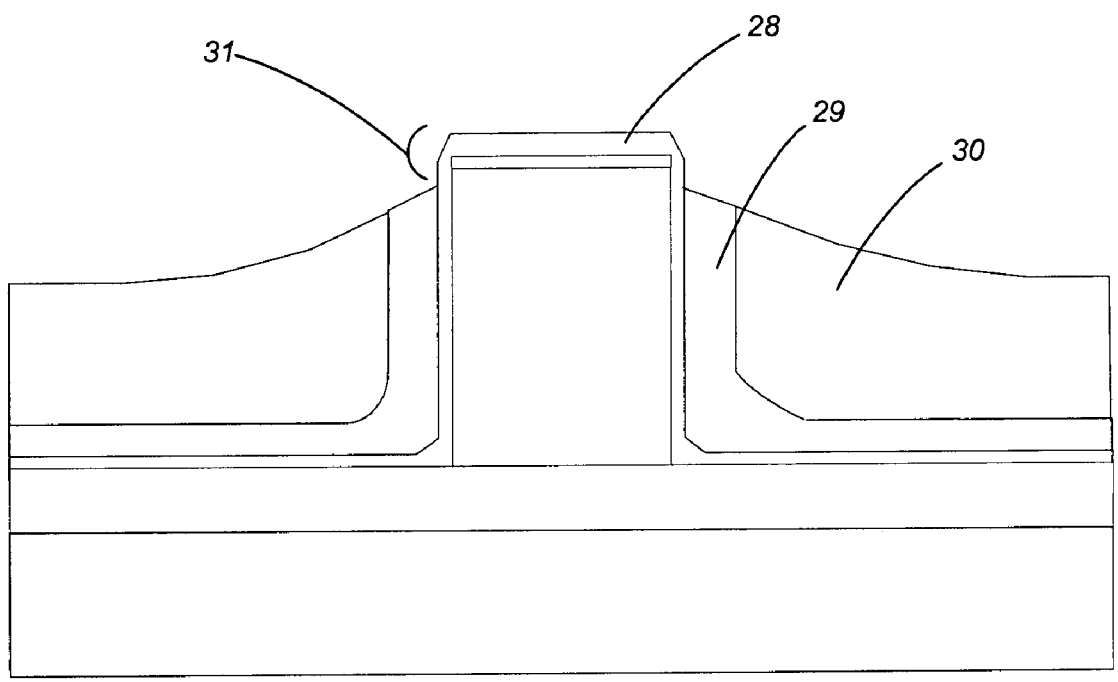
Figure 5D:
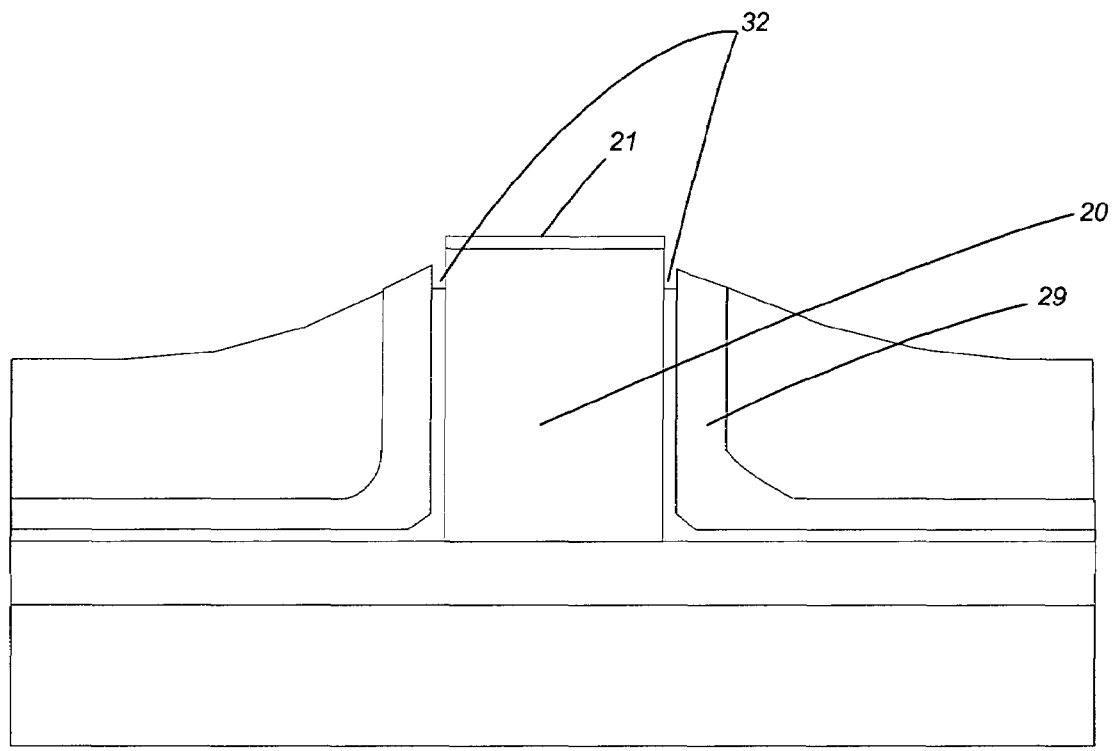
Figure 5E:
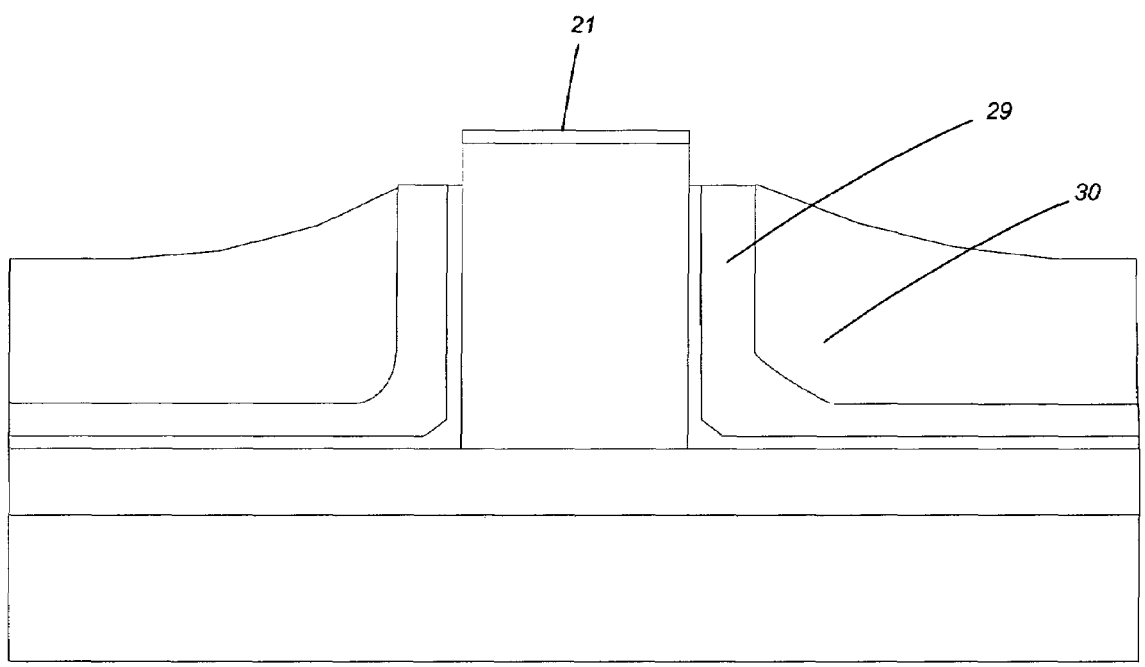

FIGS. 5C-5E show a method for removing the InP layer 28 on top of the InGaAsP contact layer using a selective etch. In this method, an epitaxial semiconductor film is selectively removed, rather than a dielectric film with much different interface chemistry. Thus, the method results in a much lower damage contact surface for improved contact resistance.

FIG. 5C shows a cross-section along plane A outlined in FIG. 5B after a dielectric layer 29 and a thick photo-resist layer 30 have been deposited on the surface covering the field and the ridge and have been etched to open the top of the mesa 31 and expose the InP layer 28. FIG. 5D shows the same structure after a selective InP etch has been performed with an HCl-water solution to remove the InP layer covering the InGaAsP contact layer 21. Other selective etches that are well-known to those skilled in the art may also be used. The etch stops on the InGaAsP contact layer 21, but produces trenches 32 to be etched between the InP mesa 20 and the dielectric layer 29. FIG. 5E shows a cross-section of the same structure after the dielectric has been selectively etched using a buffered solution of HF to suppress the trenches 32. The process can then proceed by removing the thick photo-resist 30 and depositing the top metal contact on the InGaAsP contact layer 21 and the isolation dielectric 29.

Figure 6:
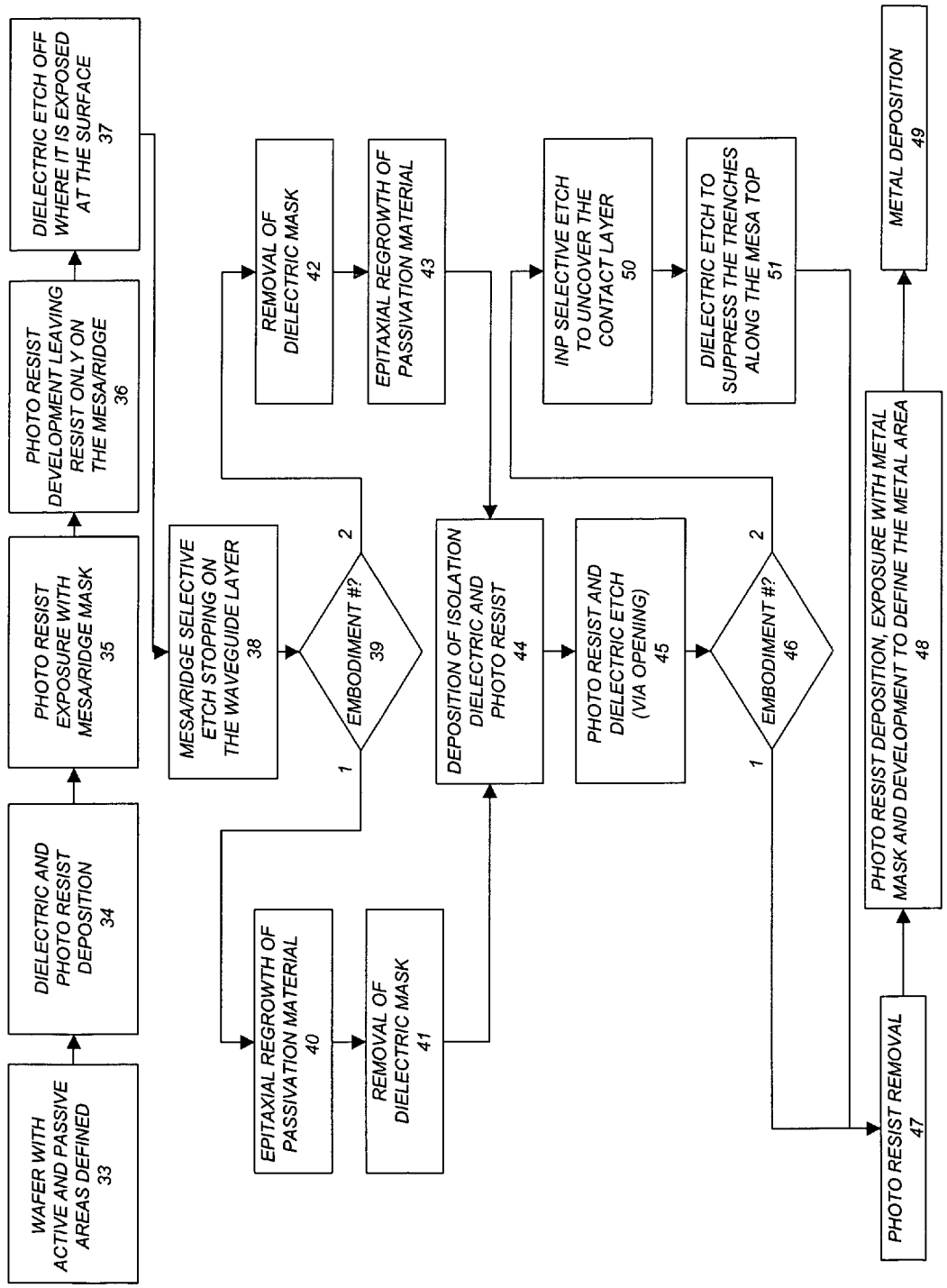
FIG. 6 is a flowchart that illustrates the steps performed in manufacturing the device according to the present invention.

FIG. 6 is a flowchart that illustrates the steps performed in manufacturing the device according to the preferred embodiment of the present invention.

Block 33 represents a wafer with active and passive areas defined thereon.

Block 34 represents a dielectric and photoresist deposition on the wafer.

Block 35 represents a photoresist exposure with a mesa/ridge mask.

Block 36 represents a photoresist development, leaving the resist only on the mesa/ridge.

Block 37 represents a dielectric etch off, where it is exposed at the surface.

Block 38 represents a mesa/ridge selective etch, stopping on the waveguide layer.

Block 39 is a decision block that determines whether a first or second embodiment of the method is used. If the first embodiment is used, then control transfers to Blocks 40 and 41; otherwise, if the second embodiment is used, then control transfers to Blocks 42 and 43. Thereafter, control transfers to Block 44 in both the first and second embodiments.

In the first embodiment, Block 40 represents an epitaxial regrowth of passivation material and Block 41 represents the removal of the dielectric mask.

In the second embodiment, Block 42 represents the removal of dielectric mask and Block 43 represents an epitaxial regrowth of passivation material.

Block 44 represents the deposition of an isolation dielectric and photoresist.

Block 45 represents a photoresist and dielectric etch (for a via opening).

Block 46 is a decision block that determines whether a first or second embodiment of the method is used. If the first embodiment is used, then control transfers to Blocks 47, 48 and 49; otherwise, if the second embodiment is used, then control transfers to Blocks 50, 51, 47, 48 and 49.

In the first embodiment, Block 47 represents the photoresist removal, Block 48 represents a photoresist deposition, exposure with a metal mask and development to define the metal area, and Block 49 represents a metal deposition.

In the second embodiment, Block 50 represents an InP selective etch to uncover the contact layer, Block 51 represents a dielectric etch to suppress trenches along the mesa top, Block 47 represents a photoresist removal, Block 48 represents a photoresist deposition, exposure with a metal mask and development to define the metal area, and Block 49 represents metal deposition.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for reducing surface recombination in an area next to a mesa in an optical semiconductor device, the method comprising the steps of:
   a) providing a semiconductor cladding material on a waveguide layer;
   b) forming the mesa on the semiconductor cladding material by selectively etching the semiconductor cladding material down to the waveguide layer forming exposed areas of the waveguide layer next to the mesa on either side thereof and of an upper cladding layer on sidewalls of the mesa; and
   c) growing a thin epitaxial layer of material with a larger bandgap than the waveguide material on the exposed areas in order to reduce carrier surface recombination within the waveguide material in the area;
   wherein step c) includes: growing a thin epitaxial layer of semiconductor material with a larger band gap than the waveguide layer over top and sidewalls of the mesa and the area next to the mesa; and removing the thin epitaxial layer from the top of the mesa to uncover the contact layer.

2. The method of claim 1, wherein the optical semiconductor device includes active sections.

3. The method of claim 1, wherein the optical semiconductor device includes passive sections.

4. The method of claim 1, wherein the optical semiconductor device is an integrated device including active and passive sections, whereby light traveling in the waveguide material travels through both the active and passive sections.

5. The method of claim 4, wherein the optical semiconductor device comprises a tunable laser.

6. The method of claim 1, wherein the thin layer is epitaxially grown by metalorganic vapor phase epitaxy (MOVPE).

7. The method of claim 1, wherein the thin layer is doped in such a manner as to avoid creating a surface leakage path.

8. The method of claim 7, wherein the thin layer is non-intentionally doped to minimize the conductivity of the thin layer.

9. The method of claim 1, wherein the waveguide is comprised of an InGaAsP alloy substantially lattice-matched to InP, and the thin layer is comprised of InP or another InGaAsP alloy substantially lattice-matched to InP and with a higher bandgap than the waveguide.

10. An optical semiconductor device having a mesa over a waveguide material, and an exposed area of waveguide material next to the mesa, wherein the optical semiconductor device is fabricated using a method for reducing surface recombination in the area next to the mesa, the method comprising:

epitaxially growing a thin layer of material with a larger bandgap than the waveguide material over the mesa and in the area next to the mesa in order to reduce carrier surface recombination within the waveguide material; and selectively removing the thin epitaxial layer of semiconductor material grown on top of the mesa to allow for formation of ohmic contacts to enable current to be injected into the waveguide at the mesa's base.

11. The device of claim 10, wherein the optical semiconductor device includes active sections.

12. The device of claim 10, wherein the optical semiconductor device includes passive sections.

13. The device of claim 10, wherein the optical semiconductor device is an integrated device including active and passive sections, whereby light traveling in the waveguide material travels through both the active and passive sections.

14. The device of claim 10, wherein the thin layer is deposited by metalorganic vapor phase epitaxy (MOVPE).

15. The device of claim 10, wherein the thin layer is non-intentionally doped to avoid creating a surface leakage path.

16. A method of making an optical semiconductor device comprised of a plurality of substantially lattice-matched layers deposited on a semiconductor substrate formed into a ridge waveguide structure comprised of a mesa on top of a waveguide layer, which has a higher index of refraction and a lower energy band gap, and a thin epitaxial semiconductor layer grown over the waveguide layer and up the mesa's sidewall having a higher energy band gap to reduce surface recombination in the waveguide layer in an area next to the mesa, the method comprising the steps of:

forming the mesa using a stripe mask on semiconductor cladding material initially grown on the waveguide layer and selectively etching the semiconductor cladding material down to the waveguide layer;

removing the stripe mask;

growing a thin epitaxial layer of semiconductor material with a larger band gap than the waveguide layer over exposed areas of the waveguide layer and the sidewalls of the mesa;

providing a mask to cover all areas except the mesa's top where the stripe mask was applied; and selectively removing the thin epitaxial layer of semiconductor material grown over the mesa to allow for formation of ohmic contacts to the mesa's top as may be needed to inject current into the waveguide at the mesa's base.

17. A method of making an optical semiconductor device comprised of a plurality of substantially lattice-matched layers deposited on a semiconductor substrate formed into a ridge waveguide structure comprised of a mesa on top of a waveguide layer having a higher index of refraction and a relatively lower energy band gap, and a thin epitaxial semiconductor layer grown over the waveguide layer and up the mesa's sidewall having a higher energy band gap to reduce surface recombination in the waveguide layer in an area next to the mesa, the method comprising the steps of:

forming the mesa using a stripe mask on semiconductor cladding material initially grown on the waveguide layer and selectively etching the semiconductor cladding material down to the waveguide layer;

growing a thin epitaxial layer of semiconductor material with a larger band gap than the waveguide material over exposed areas of the waveguide layer and the sidewalls of the mesa; and removing the stripe mask over the mesa to allow for formation of ohmic contacts to the mesa's top as may be needed to inject current into the waveguide at the mesa's base.

18. The method according to claim 1, wherein step c) also includes providing a mask to cover all areas except the top of the mesa.

19. The method according to claim 18, wherein the mask includes a dielectric layer and a photo-resist layer.

* * * * *